United States Patent
Majima et al.

(10) Patent No.: US 11,437,190 B2
(45) Date of Patent: Sep. 6, 2022

(54) FILM CAPACITOR, AND EXTERIOR CASE FOR FILM CAPACITOR

(71) Applicants: Murata Manufacturing Co., Ltd., Nagaokakyo (JP); Shizuki Electric Co., Inc., Nishinomiya (JP)

(72) Inventors: Ryo Majima, Nagaokakyo (JP); Takuya Sakamoto, Nishinomiya (JP); Satoru Jogan, Nagaokakyo (JP)

(73) Assignees: MURATA MANUFACTURING CO., LTD., Nagaokakyo (JP); SHIZUKI ELECTRIC CO., INC., Nishinomiya (JP)

( * ) Notice: Subject to any disclaimer, the term of this patent is extended or adjusted under 35 U.S.C. 154(b) by 0 days.

(21) Appl. No.: 16/884,575

(22) Filed: May 27, 2020

(65) Prior Publication Data

US 2020/0294718 A1    Sep. 17, 2020

Related U.S. Application Data

(63) Continuation of application No. PCT/JP2019/002447, filed on Jan. 25, 2019.

(30) Foreign Application Priority Data

Jan. 25, 2018  (JP) .............................. JP2018-010869

(51) Int. Cl.
*C08L 63/00* (2006.01)
*H01G 4/005* (2006.01)
(Continued)

(52) U.S. Cl.
CPC ............. *H01G 4/224* (2013.01); *C08J 5/18* (2013.01); *C08K 5/13* (2013.01); *C08K 7/00* (2013.01);
(Continued)

(58) Field of Classification Search
CPC ...... C08J 2375/04; C08J 2429/14; C08J 5/18; C08K 13/04; C08K 3/36; C08K 5/13;
(Continued)

(56) References Cited

U.S. PATENT DOCUMENTS 5,461,256 A   10/1995  Yamada et al.
7,911,765 B2   3/2011  Takeoka et al.
(Continued)

FOREIGN PATENT DOCUMENTS

CN   202076136 U   12/2011
CN   202076137 U   12/2011
(Continued)

OTHER PUBLICATIONS

How to convert ppm_k and ppm_c_diyAudio_pp. 1-3_May 2012.*
(Continued)

*Primary Examiner* — Timothy J Thompson
*Assistant Examiner* — Guillermo J Egoavil
(74) *Attorney, Agent, or Firm* — ArentFox Schiff LLP

(57) ABSTRACT

A film capacitor that includes a capacitor element having a metallized film including a resin film and a metal layer on a surface of the resin film; an outer case that houses the capacitor element; and a filling resin that fills a space between the capacitor element and the outer case, wherein a surface free energy of an inner surface of the outer case in contact with the filling resin is 44 mN/m or less.

25 Claims, 6 Drawing Sheets

(51) Int. Cl.
  *H01G 4/224* (2006.01)
  *H01G 4/32* (2006.01)
  *H01G 4/33* (2006.01)
  *H05K 1/03* (2006.01)
  *C08J 5/18* (2006.01)
  *C08K 5/13* (2006.01)
  *C08K 7/00* (2006.01)
  *C08K 7/04* (2006.01)
  *C08K 13/04* (2006.01)

(52) U.S. Cl.
  CPC ............... *C08K 7/04* (2013.01); *C08K 13/04* (2013.01); *C08L 63/00* (2013.01); *H01G 4/005* (2013.01); *H01G 4/32* (2013.01); *H01G 4/33* (2013.01); *H05K 1/0373* (2013.01); *C08J 2375/04* (2013.01)

(58) Field of Classification Search
  CPC .... C08K 7/00; C08K 7/04; C08K 7/14; C08L 101/12; C08L 63/00; C08L 67/03; C08L 81/04; H01G 2/103; H01G 2/106; H01G 4/005; H01G 4/224; H01G 4/232; H01G 4/30; H01G 4/32; H01G 4/33; H05K 1/0373; H05K 1/03
  USPC ............ 361/301.1, 500, 305, 301.4; 174/260
  See application file for complete search history.

(56) References Cited

U.S. PATENT DOCUMENTS

| | | | |
|---|---|---|---|
| 2006/0104006 A1* | 5/2006 | Saito | H01G 4/224 361/301.3 |
| 2008/0310075 A1 | 12/2008 | Takeoka et al. | |
| 2009/0173903 A1* | 7/2009 | Kaneko | F16K 27/06 251/368 |
| 2010/0091425 A1 | 4/2010 | Takeoka et al. | |
| 2010/0202095 A1 | 8/2010 | Kyouda et al. | |
| 2013/0003416 A1* | 1/2013 | Saga | C09K 19/02 362/633 |
| 2014/0356523 A1 | 12/2014 | Fultz | |

FOREIGN PATENT DOCUMENTS

| | | | | | |
|---|---|---|---|---|---|
| CN | 106098372 | A | | 11/2016 | |
| CN | 107400361 | A | * | 11/2017 | ............. B29C 48/92 |
| CN | 207338136 | U | | 5/2018 | |
| EP | 2557122 | A1 | | 2/2013 | |
| JP | S5376355 | A | | 7/1978 | |
| JP | S57157512 | A | | 9/1982 | |
| JP | H02153712 | A | | 6/1990 | |
| JP | H0448506 | A | | 2/1992 | |
| JP | H04277657 | A | | 10/1992 | |
| JP | H06143884 | A | | 5/1994 | |
| JP | H07176795 | A | * | 7/1995 | ............. H01L 21/56 |
| JP | 2002110449 | A | | 4/2002 | |
| JP | 2005197620 | A | | 7/2005 | |
| JP | 2005222910 | A | * | 8/2005 | ............. H01G 4/145 |
| JP | 2005222910 | A | | 8/2005 | |
| JP | 2007173351 | A | | 7/2007 | |
| JP | 2007290380 | A | * | 11/2007 | ............. H01G 4/015 |
| JP | 2007311625 | A | | 11/2007 | |
| JP | 2008087327 | A | * | 4/2008 | ............. B32B 15/09 |
| JP | 2008188918 | A | * | 8/2008 | ............. B32B 15/09 |
| JP | 2009010265 | A | | 1/2009 | |
| JP | 4733566 | B2 | | 7/2011 | |
| JP | 4968788 | B2 | | 7/2012 | |
| JP | 2016041790 | A | * | 3/2016 | ............. C08G 59/68 |
| JP | 2016100610 | A | | 5/2016 | |
| WO | 2006109732 | A1 | | 10/2006 | |

OTHER PUBLICATIONS

International Search Report issued for PCT/JP2019/002456, dated Apr. 16, 2019.
Written Opinion of the International Searching Authority issued for PCT/JP2019/002456, dated Apr. 16, 2019.
International Search Report issued for PCT/JP2019/002447, dated Apr. 16, 2019.
Written Opinion of the International Searching Authority issued for PCT/JP2019/002447, dated Apr. 16, 2019.
Chinese Office Action issued for Chinese Application No. 201980007435.X, dated Chinese Office Action Oct. 13, 2021.
Extended European Search Report issued for EP Patent Application No. 19 74 3377.4, dated Oct. 22, 2021.
Japanese Office Action issued for Japanese Application No. 2019-567186, dispatch date of Japanese Office Action dated Dec. 7, 2021.
Extended European Search Report issued for EP Patent Application No. 19 74 4167.8, dated Sep. 28, 2021.

* cited by examiner

FILM CAPACITOR, AND EXTERIOR CASE FOR FILM CAPACITOR

CROSS REFERENCE TO RELATED APPLICATIONS

The present application is a continuation of International application No. PCT/JP2019/002447, filed Jan. 25, 2019, which claims priority to Japanese Patent Application No. 2018-010869, filed Jan. 25, 2018, the entire contents of each of which are incorporated herein by reference.

FIELD OF THE INVENTION

The present invention relates to a film capacitor and an outer case of the film capacitor.

BACKGROUND OF THE INVENTION

A metallized film capacitor is produced by, for example, providing a capacitor element including one or more wound or laminated metallized films, each metallized film including a metal deposited film on a surface of a resin film, housing the capacitor element in an outer case, filling the outer case with a resin, and curing the resin.

Patent Literature 1 discloses a metallized film capacitor, wherein a case that houses a capacitor element is a molded product of a mixture of polyphenylene sulfide resin with 50 to 85 wt % glass fiber, a resin that fills the case is an epoxy resin to which 50 to 80 wt % silica is added to achieve a glass transition temperature of 115° C. or higher and a viscosity at 60° C. of 1500 to 3000 mPa·s.

Patent Literature 1: JP 4968788 B

SUMMARY OF THE INVENTION

According to Patent Literature 1, the metallized film capacitor including a case that contains 50 to 85 wt % glass fiber provides improved adhesion between the resin and the case, so that presumably no separation occurs at an interface between the case and resin even after 2000 times of a temperature cycle test at −40° C. to +120° C.

The metallized film capacitor (hereinafter also simply referred to as a "film capacitor"), however, is required to have heat resistance suitable for use in higher temperature environments. It was found that separation at an interface between the outer case and the filling resin may not be reduced or prevented simply by controlling the amount of filler such as glass fiber contained in the outer case.

The above problem is not peculiar to outer cases made of polyphenylene sulfide resin. It is a problem common to film capacitors including outer cases made of other resin, metal, and the like.

The present invention was made to solve the above problem, and aims to provide a film capacitor capable of reducing or preventing separation at an interface between an outer case and a filling resin even when used repeatedly in a high temperature environment. The present invention also aims to provide an outer case for the film capacitor.

The film capacitor of the present invention includes a capacitor element having a metallized film including a resin film and a metal layer on a surface of the resin film, an outer case that houses the capacitor element, and a filling resin that fills a space between the capacitor element and the outer case, wherein a surface free energy of an inner surface of the outer case in contact with the filling resin is 44 mN/m or less.

An outer case of a film capacitor of the present invention is arranged to house a capacitor element having a metallized film including a resin film and a metal layer on a surface of the resin film, wherein a filling resin fills a space between the capacitor element and the outer case to fix the capacitor element when the capacitor element is housed inside the outer case, and a surface free energy of an inner surface of the outer case in contact with the filling resin is 44 mN/m or less.

The present invention provides a film capacitor capable of reducing or preventing separation at an interface between an outer case and a filling resin even when used repeatedly in a high temperature environment.

DETAILED DESCRIPTION OF THE PREFERRED EMBODIMENTS

Figure 1A:
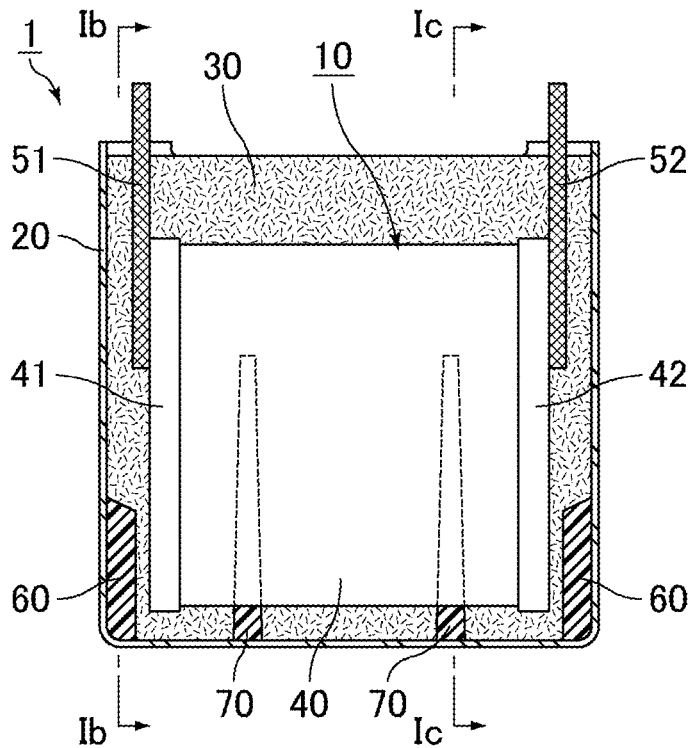
FIG. 1A is a schematic cross-sectional view of a film capacitor according to an embodiment of the present invention.

The film capacitor of the present invention is described below.

The present invention is not limited to the following preferred embodiments, and may be suitably modified without departing from the gist of the present invention.

Combinations of two or more preferred features described in the following preferred features are also within the scope of the present invention.

An outer case of a film capacitor described below is also encompassed by the present invention.

The film capacitor of the present invention includes a capacitor element including a metallized film, an outer case that houses the capacitor element, and a filling resin that fills a space between the capacitor element and the outer case.

In the film capacitor of the present invention, a surface free energy of an inner surface of the outer case in contact with the filling resin is 44 mN/m or less. When the surface free energy of the inner surface of the outer case is 44 mN/m or less, it improves adhesion between the outer case and the filling resin. Thus, separation at an interface between the outer case and the filling resin can be reduced or prevented even when the film capacitor is used repeatedly in a high temperature environment.

Preferably, the surface free energy of the inner surface of the outer case is 34 mN/m or less. When the surface free energy is 34 mN/m or less, separation at an interface between the outer case and the filling resin can be further reduced or prevented. At the same time, preferably, the surface free energy of the inner surface of the outer case is 25 mN/m or more.

The surface free energy of the inner surface of the outer case can be calculated based on the Kitazaki-Hata theory by measuring contact angles of three liquids serving as reagents including water, ethylene glycol and diiodomethane whose surface free energies are known. The contact angle of each liquid means a contact angle of a drop of each liquid measured using a contact angle meter (e.g., DM-701 available from Kyowa Interface Science Co., Ltd.) immediately after dropping in an environment at 25° C. with 50% RH.

In the film capacitor of the present invention, preferably, the difference in coefficient of linear expansion between the outer case and the filling resin is 11 ppm/° C. or less. When the film capacitor is used repeatedly in a high temperature environment, the separation at an interface between the outer case and the filling resin can be reduced or prevented by reducing the difference in coefficient of linear expansion between the outer case and the filling resin.

More preferably, the difference in coefficient of linear expansion between the outer case and the filling resin is 10 ppm/° C. or less. At the same time, the difference in coefficient of linear expansion between the outer case and the filling resin is preferably more than 0 ppm/° C., more preferably 2 ppm/° C. or more.

The coefficients of linear expansion of the outer case and the filling resin may be coefficients of materials given in the catalog. The coefficient of linear expansion of the outer case is influenced by the machine direction during injection molding. Thus, the coefficient of linear expansion is determined in each of the machine direction (MD direction) and the transverse direction (TD direction), and an average determined from (MD+TD)/2 is defined as the coefficient of linear expansion of the outer case. The actual measurement can be performed by using a test piece (10 mm×1 mm×5 mm) by a thermomechanical analyzer (TMA). Specifically, the measurement is performed based on the method specified in JIS K 7197:2012 (Testing method for linear thermal expansion coefficient of plastics by Thermomechanical Analysis) in which a load is gently applied to an end of a test piece at room temperature and the temperature is increased to record the whole process of displacement of the test piece, and the obtained result is compared with the result of the standard sample.

Figure 1B:
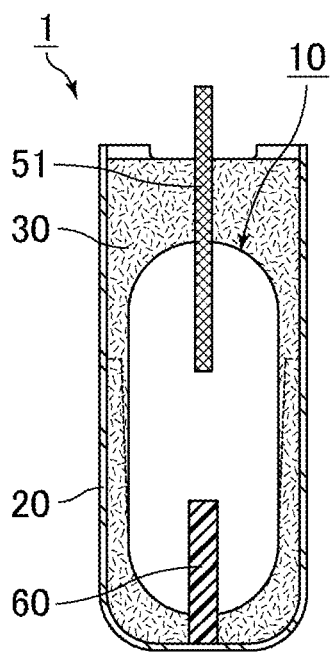
FIG. 1B is a cross-sectional view taken along line Ib-Ib of the film capacitor shown in FIG. 1A.
Figure 1C:
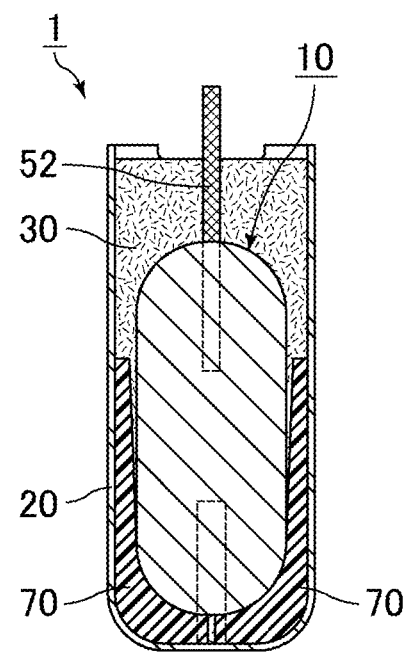
FIG. 1C is a cross-sectional view taken along line Ic-Ic of the film capacitor shown in FIG. 1A.

FIG. 1A is a schematic cross-sectional view of a film capacitor according to an embodiment of the present invention. FIG. 1B is a cross-sectional view taken along line Ib-Ib of the film capacitor shown in FIG. 1A. FIG. 1C is a cross-sectional view taken along line Ic-Ic of the film capacitor shown in FIG. 1A.

A film capacitor 1 shown in FIG. 1A, FIG. 1B, and FIG. 1C includes a capacitor element 10, an outer case 20 that houses the capacitor element 10, and a filling resin 30 that fills a space between the capacitor element 10 and the outer case 20.

In the film capacitor 1 shown in FIG. 1A, FIG. 1B, and FIG. 1C, a rectangular parallelepiped space is formed in the outer case 20, and the capacitor element 10 is disposed apart from inner surfaces of the outer case 20 and at a center in the outer case 20. In order to hold the capacitor element 10, the space between outer surfaces of the capacitor element 10 and the inner surfaces of the outer case 20 is filled with the filling resin 30 such as an epoxy resin. The outer case 20 has a bottomed tubular shape having an opening at one end. The filling resin 30 fills the inside of the outer case 20, from the opening of the outer case 20 to surround the capacitor element 10. The outer case 20 and the capacitor element 10 can be bonded and fixed together as the epoxy resin is thermally cured.

In FIG. 1A, the capacitor element 10 includes a wound body 40 of metallized films, and a first external electrode 41 and a second external electrode 42 on both sides of the wound body 40. A first lead terminal 51 is electrically connected to the first external electrode 41, and a second lead terminal 52 is electrically connected to the second external electrode 42. The first lead terminal 51 and the second lead terminal 52 protrude from the inside to the outside of the outer case 20.

In the film capacitor 1 shown in FIG. 1A, FIG. 1B, and FIG. 1C, a first rib 60 and a second rib 70 are provided on the inner surfaces of the outer case 20. The first rib 60 is provided adjacent to the first external electrode 41 and/or the second external electrode 42. The first rib 60 is a plate extending from the bottom toward the opening of the outer case 20, and its end surface facing the opening has a tapered shape that gradually reduces in length from the outer case 20 toward the capacitor element 10. One first rib 60 and another first rib 60 each in the form of a plate make a pair. One of them connects between the bottom of the outer case 20 and an inner surface of a third lateral wall 23 shown in FIG. 2A, and the other one connects between the bottom of the outer case 20 and an inner surface of a fourth lateral wall 24 shown in FIG. 2A. In FIG. 1B, the first rib 60 is located at a center of the outer case 20 in a width direction, and is thus located on the same axis of the first lead terminal 51. In addition, the first rib 60 is located on the bottom below the center of the outer case 20 in the direction from the bottom to the opening. The second rib 70 is provided on the bottom of the outer case 20. The second rib 70 is a plate extending from the bottom toward the opening of the outer case 20. In FIG. 1A, one second rib 70 and another second rib 70 each in the form of a plate are spaced apart from each other in the outer case 20 and make a pair. As shown in FIG. 1C, each second rib 70 has an outer surface shape conforming to the inner surface shape of the outer case 20 and has an inner surface shape that is a U-shape generally conforming to the outer surfaces of the capacitor element 10. One plate (on the left side in FIG. 1A) defining one second ribs 70 is divided into a first part and a second part, as shown on the left and right sides in FIG. 1C. The first part connects between the bottom of the outer case 20 and an inner surface of a first lateral wall 21 shown in FIG. 2B, and the second part connects the bottom of the outer case 20 and an inner surface of a second lateral wall 22 shown in FIG. 2B. As shown in FIG. 1A, one plate defining one second rib 70 is located between the center of the capacitor element 10 and the first external electrode 41, and the other plate defining the other second rib 70 is located between the center of the capacitor element 10 and the second external electrode 42. In addition, as shown in FIG. 1C, the second rib 70 extends above the center of the capacitor element 10 toward the opening, and an upper end of the second rib 70 is closer to the opening than a lower end of the second lead terminal 52. Providing the ribs on the inner surfaces of the outer case can improve the positional accuracy of the capacitor element during casting of the resin.

The outer case may not include any ribs on the inner surfaces. When ribs are provided on the inner surface of the outer case, the number of ribs is not limited. The shape of each rib is also not limited. For example, the thickness and length of the rib and how much the rib protrudes may be suitably changed.

Outer Case

The outer case defining the film capacitor of the present invention has, for example, a bottomed tubular shape including an opening at an end.

Figure 2A:
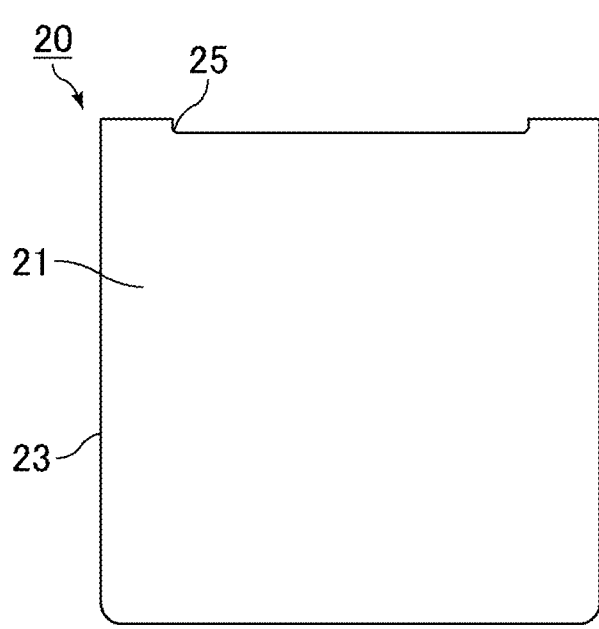
FIG. 2A is a schematic front view of an example of an outer case defining the film capacitor shown in FIG. 1A.
Figure 2B:
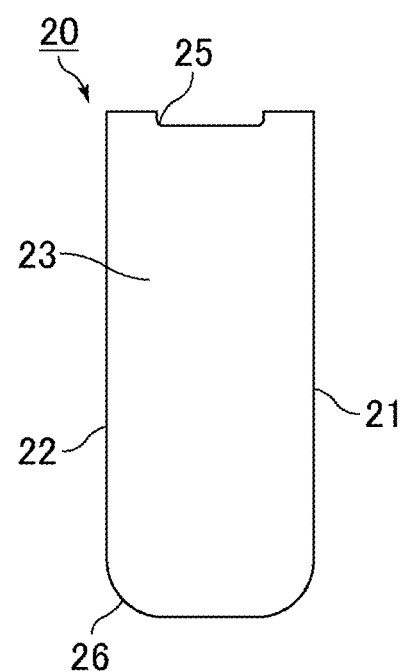
FIG. 2B is a side view of the outer case shown in FIG. 2A.

FIG. 2A is a schematic front view of an example of an outer case defining the film capacitor shown in FIG. 1A. FIG. 2B is a side view of the outer case shown in FIG. 2A.

The outer case 20 shown in FIG. 2A and FIG. 2B has a bottomed quadrangular tubular shape. The bottomed quadrangular tubular shape includes a substantially rectangular opening at one end (see FIG. 1A, FIG. 1B, and FIG. 1C), quadrangular tubular lateral portions with four flat plates extending from the four sides of the opening to the other end, and a bottom opposing the opening and sealing the other end. The outer case 20 may have a shape such as a bottomed cylindrical shape.

The lateral portions of the outer case 20 include the first lateral wall 21, the second lateral wall 22 having substantially the same area as the first lateral wall 21 and spaced apart from and opposite to an inner surface of the first lateral wall 21, the third lateral wall 23 connecting between one side of the first lateral wall 21 and one side of the second lateral wall 22 and having a smaller area than the first lateral wall 21, and the fourth lateral wall 24 connecting between the other side of the first lateral wall 21 and the other side of the second lateral wall 22, having substantially the same area as the third lateral wall 23, and spaced apart from and opposite to an inner surface of the third lateral wall 23.

As shown in FIG. 2A and FIG. 2B, preferably, the lateral portions of the outer case 20 each include a depression 25 on the four sides of the opening. The depressions 25 are formed downward from the opening toward the bottom, and extend along the respective four sides of the opening. Providing the depressions on the opening surface of the outer case prevents an increase in inner pressure due to hermetic sealing between the film capacitor and a substrate when the film capacitor is mounted on the substrate. The outer case may also not include any depressions.

As shown in FIG. 2A and FIG. 2B, preferably, each lateral portion of the outer case 20 includes a tapered portion 26 extending along a side connecting between the lateral walls. In FIG. 2A and FIG. 2B, the tapered portion 26 is provided at the corner on the bottom of each of the third lateral wall 23 and the fourth lateral wall 24. Thus, a tapered portion is also provided on the side connecting between the lower side of the first lateral wall 21 and the bottom, and a tapered portion is also provided on the side connecting between the lower side of the second lateral wall 22 and the bottom. The lateral portions of the outer case may not include any tapered portions.

In the film capacitor of the present invention, the outer case may be made of a resin composition, or may be made of a metal or an alloy.

In the film capacitor of the present invention, it is preferred to reduce or prevent heating of the capacitor element inside the film capacitor in order to reduce or prevent evaporation of moisture contained in the capacitor element. Thus, preferably, the outer case is opaque (e.g., black) even when used at a high temperature of 100° C. The term "opaque" as used herein means that the outer case has a transmittance of visible light having a wavelength of 400 nm to 700 nm of 5% or less.

When the outer case is made of a resin composition, preferably, the resin composition contains a liquid crystal polymer (LCP).

In the later-described examples, the LCP contained in the resin composition is one containing p-hydroxybenzoic acid and 6-hydroxy-2-naphthoic acid group in the skeleton. Other LCPs that can be used are those obtained by polycondensation of various components such as phenol, phtalic acid, and ethylene terephtalate, other than p-hydroxybenzoic acid and 6-hydroxy-2-naphthoic acid group.

LCP can be classified into type I, type II, and type III. Yet, examples of materials include those of the LCP mentioned above.

Preferably, the resin composition further contains an inorganic filler in addition to LCP.

The inorganic filler contained in the resin composition may be a material having higher strength than the LCP. The inorganic filler is preferably a material having a higher melting point than the LCP, and is more preferably a material having a melting point of 680° C. or higher.

The form of the inorganic filler is not limited. Examples thereof include those having a shape with a longitudinal direction, such as fibrous inorganic fillers and plate-shaped inorganic fillers. Two or more of these inorganic fillers may be used in combination. Thus, preferably, the resin composition contains a fibrous inorganic material and/or a plate-shaped inorganic material as the inorganic filler.

As used herein, the term "fibrous" refers to a shape in which the length of the filler in the longitudinal direction and the cross-sectional diameter in a cross section perpendicular to the longitudinal direction satisfy the following relationship where the length in longitudinal direction divided by the cross-sectional diameter is greater than or equal to 5 (i.e., the aspect ratio is 5:1 or greater). Here, the cross-sectional diameter is the distance between two points with the longest distance therebetween on the outer circumference of the cross section. When the cross-sectional diameter varies in the longitudinal direction, a portion with the largest cross-sectional diameter is used for the measurement.

The term "plate-shaped" refers to a shape in which the cross-sectional diameter of a surface having the largest projected area and the maximum height in a direction perpendicular to the cross section satisfy the following relationship where the cross-sectional diameter divided by the height is greater than or equal to 3.

Preferably, the inorganic filler is dispersed in the outer case, and at least a portion of the filler is oriented from the bottom of the case toward the opening on each of the lateral wall of the lateral portions of the outer case and that at least a portion of the filler is oriented toward the adjacent lateral walls.

Preferably, the inorganic filler has a diameter of at least 5 μm and a length of at least 50 μm. In particular, preferably, the inorganic filler is dispersed throughout the outer case, without forming aggregations.

Specific examples of the inorganic filler include materials such as fibrous glass filler, plate-shaped talc, and plate-shaped mica. In particular, the inorganic filler preferably include a glass filler as a main component.

When the outer case is made of a resin composition containing LCP and an inorganic filler, the amount of the inorganic filler in the resin composition is preferably 54 wt % or less, more preferably 50 wt % or less, in order to ensure moldability of the outer case. At the same time, the amount of the inorganic filler in the resin composition is preferably 30 wt % or more, more preferably 45 wt % or more.

The amount of the inorganic filler in the resin composition can be determined as follows: using a 0.5-mm thick test piece (20 mm×20 mm), the weight of residual components regarded as inorganic components is measured by ash measurement or thermogravimetric analysis, and the amount of the inorganic filler is calculated from the initial weight and the weight of the residual components.

Specifically, the measurement method includes burning organic materials and heating the combustion residue at a high temperature until a constant mass is obtained, based on JIS K 7250 Method A (direct incineration method).

When the outer case is made of a resin composition containing LCP and an inorganic filler, the amount of the LCP in the resin composition is preferably 46 wt % to 70 wt %, more preferably 50 wt % to 55 wt %.

When the outer case is made of a resin composition, the resin composition may contain polyphenylene sulfide (PPS) instead of LCP.

Preferably, the resin composition further contains an inorganic filler in addition to PPS.

The inorganic filler contained in the resin composition containing PPS may be the same as that contained in the resin composition containing LCP.

Preferably, the resin composition contains a fibrous inorganic material and/or a plate-shaped inorganic material as the inorganic filler. Specific examples of the inorganic filler include materials such as fibrous glass filler, plate-shaped talc, and plate-shaped mica. In particular, preferably, the inorganic filler contains a glass filler as a main component.

When the outer case is made of a resin composition containing PPS and an inorganic filler, preferably, the amount of the inorganic filler in the resin composition is 60 wt % or less, in order to ensure moldability of the outer case. At the same time, the amount of the inorganic filler in the resin composition is preferably 30 wt % or more, more preferably 45 wt % or more.

When the outer case is made of a resin composition containing PPS and an inorganic filler, the amount of PPS in the resin composition is preferably 40 wt % to 70 wt %, more preferably 40 wt % to 55 wt %.

The outer case made of a resin composition can be produced by, for example, a method such as injection molding.

When the outer case is made of a metal or an alloy, a material such as aluminum, magnesium, iron, stainless steel, copper, or an alloy thereof can be used. Of these, aluminum or an aluminum alloy is preferred.

The outer case made of a metal or an alloy can be produced by, for example, a method such as impact molding.

Filling Resin

In the film capacitor of the present invention, the filling resin fills the space between the capacitor element and the outer case.

The filling resin can be suitably selected according to a required function.

Preferably, the filling resin includes an epoxy resin. In the later-described examples, a bisphenol A epoxy resin is used, and an acid anhydride curing agent is used as a curing agent for an epoxy resin. Silica is used as a reinforcing agent.

The filling resin may be, for example, an epoxy resin or a silicone resin. The curing agent for an epoxy resin may be an amine curing agent or an imidazole curing agent.

The filling resin may contain only resin, or may also contain a reinforcing agent in order to improve the strength. The reinforcing agent may be silica or alumina.

The capacitor element can be shielded from outside air by filling the space between the capacitor element and the outer case with the filling resin. Thus, it is preferred to suitably select a low moisture-permeable resin and increase the thickness of the resin at the opening of the outer case.

Preferably, the resin at the opening of the outer case is sufficiently thick in the acceptable range of volume (physical size) of the whole capacitor.

Specifically, the thickness is preferably 2 mm or more, more preferably 4 mm or more. In particular, more preferably, the capacitor element 10 in the outer case 20 is arranged closer to the bottom than the opening of the outer case 20 as shown in FIG. 1A, FIG. 1B, and FIG. 1C, so that the thickness of the resin above the capacitor element 10 (the resin on the opening side of the outer case 20) is greater than the thickness of the resin below the capacitor element 10 (the resin on the bottom side of the outer case 20.

As for the relationship between the height of the filling resin and the height of the outer case, the resin may not fill the outer case up to the top, may fill the outer case up to the top, or may slightly overfill the outer case due to surface tension, while the resin at the opening of the outer case is made as thick as possible.

Generally, the film capacitor tends to be constantly exposed to vibration depending on the use environment. Thus, the filling resin is required to have a predetermined hardness so that the capacitor element in the outer case does not move due to vibration. In addition, since the high temperature heat resistance is required depending on the use environment of the film capacitor, a resin whose strength (viscosity) decreases at a high temperature cannot be used. The filling resin is required to have a predetermined hardness also in such a case where the high temperature heat resistance is required. At the same time, as the hardness of the filling resin increases, higher stress is generated by expansion of the capacitor element, which makes the outer case more easily deformable.

In the film capacitor of the present invention, when the outer case is made of a resin composition containing LCP and an inorganic filler, deformation of the outer case can be reduced or prevented even when the hardness of the filling resin is high (e.g., durometer hardness of 85 or more; measurement method: JIS K 7215).

Capacitor Device

In the film capacitor of the present invention, for example, the capacitor element has a pillar shape having an oblong cross section, and includes external electrodes formed by, for example, metal spraying at both ends of the pillar shape in the central axis direction.

Figure 3A:
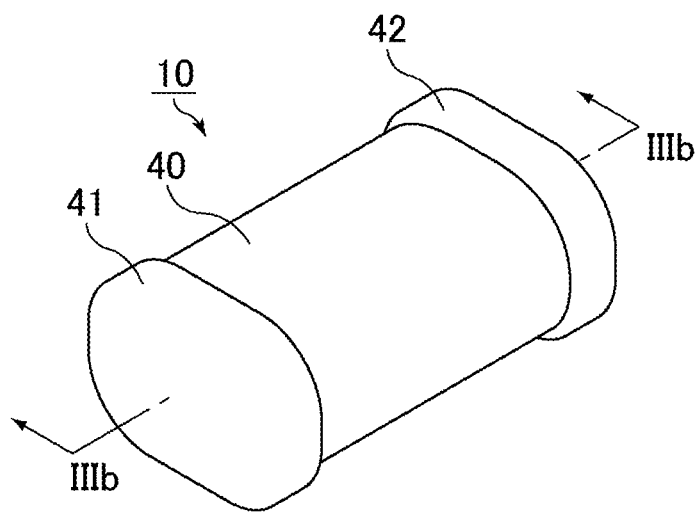
FIG. 3A is a schematic perspective view of an example of a capacitor element defining the film capacitor of the present invention.
Figure 3B:
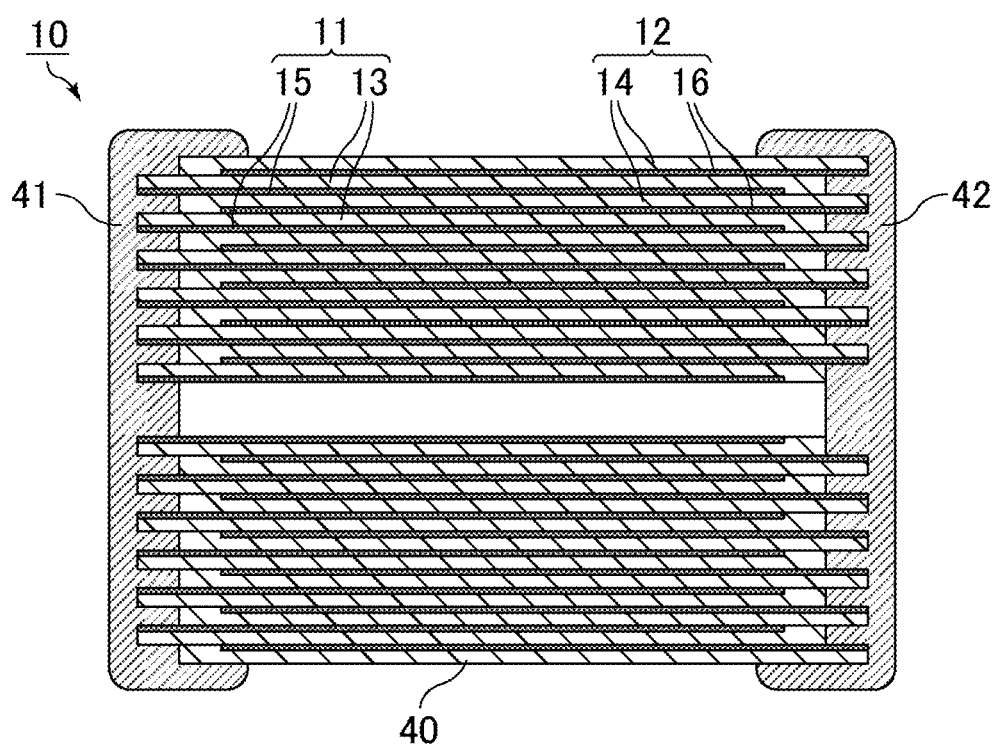
FIG. 3B is a cross-sectional view taken along line IIIb-IIIVb of the capacitor element shown in FIG. 3A.

FIG. 3A is a schematic perspective view of an example of the capacitor element defining the film capacitor of the present invention. FIG. 3B is a cross-sectional view taken along line IIIb-IIIb of the capacitor element shown in FIG. 3A.

The capacitor element 10 shown in FIG. 3A and FIG. 3B includes the wound body 40 of metallized films in which a first metallized film 11 and a second metallized film 12 are wound in a laminated state, and the first external electrode 41 and the second external electrode 42 are connected to both ends of the wound body 40. As shown in FIG. 3B, the first metallized film 11 includes a first resin film 13 and a first metal layer (counter electrode) 15 on a surface of the first resin film 13. The second metallized film 12 includes a second resin film 14 and a second metal layer (counter electrode) 16 on a surface of the second resin film 14.

As shown in FIG. 3B, the first metal layer 15 and the second metal layer 16 oppose each other with the first resin film 13 or the second resin film 14 therebetween. Further, the first metal layer 15 is electrically connected to the first external electrode 41, and the second metal layer 16 is electrically connected to the second external electrode 42.

The first resin film 13 and the second resin film 14 may have different configurations, but preferably have the same configuration.

The first metal layer 15 is formed on one side of the first resin film 13 such that it extends to a first end but not to a second end. The second metal layer 16 is formed on one side of the second resin film 14 such that it extends to the second end but not to the first end. The first metal layer 15 and the second metal layer 16 are aluminum layers, for example.

Figure 4:
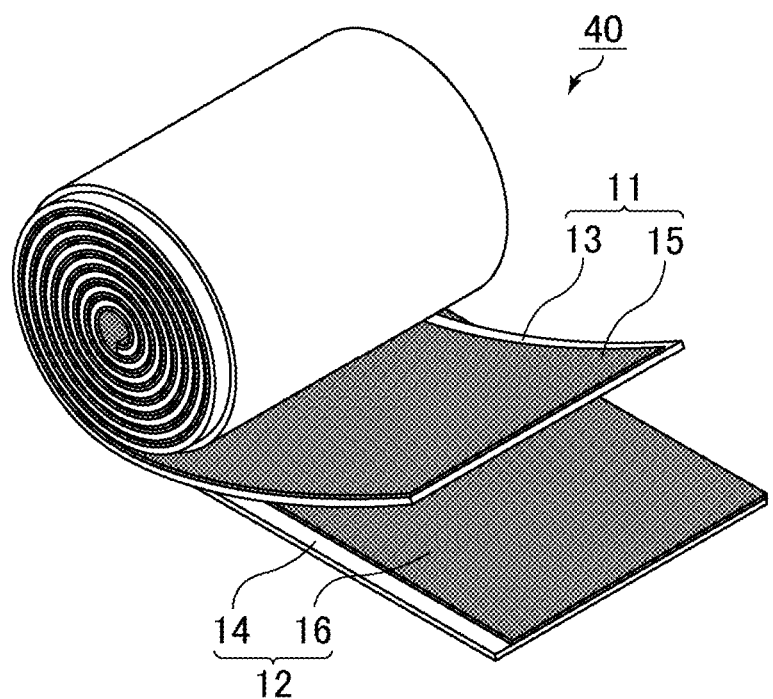
FIG. 4 is a schematic perspective view of an example of a wound body of metallized films defining the capacitor element shown in FIG. 3A and FIG. 3B.

FIG. 4 is a schematic perspective view of an example of the wound body of the metallized films defining the capacitor element shown in FIG. 3A and FIG. 3B.

As shown in FIG. 3B and FIG. 4, the first resin film 13 and the second resin film 14 are laminated in a displaced relationship from each other in a width direction (in FIG. 3B, in a left-to-right direction) such that one end of the first metal layer 15 which extends to the periphery of the first resin film 13 is exposed from the laminate of the films and that one end of the second metal layer 16 which extends to the periphery of the second resin film 14 is also exposed from the laminate of the films. As shown in FIG. 4, the first resin film 13 and the second resin film 14 are wound in a laminated state into the wound body 40. The first metal layer 15 and the second metal layer 16 are laminated while they maintain a state in which one end of the first metal layer 15 and one end of the second metal layer 16 are exposed.

In FIG. 3B and FIG. 4, the first resin film 13 and the second resin film 14 are wound such that the second resin film 14 is outside the first resin film 13 and that the first metal layer 15 and the second metal layer 16 face inside.

The first external electrode 41 and the second external electrode 42 are formed by, for example, spraying zinc or the like onto both end surfaces of the wound body 40 of the metallized films obtained as described above. The first external electrode 41 is in contact with the exposed end of the first metal layer 15, and is thus electrically connected to the first metal layer 15. The second external electrode 42 is in contact with the exposed end of the second metal layer 16, and is thus electrically connected to the second metal layer 16.

In the film capacitor of the present invention, preferably, the resin films defining the capacitor element have heat resistance up to 125° C. or higher.

In this case, the film capacitor can be used in a high-temperature environment of 125° C. or higher. At the same time, use of the film capacitor in an environment at 125° C. or higher causes expansion of the capacitor element as moisture evaporates between the resin films, making the outer case more easily deformable.

In the film capacitor of the present invention, when the outer case is made of a resin composition containing LCP and an inorganic filler, deformation of the outer case can be reduced or prevented even when the film capacitor is used in a high-temperature environment (e.g., 125° C. or higher).

In the film capacitor of the present invention, preferably, the resin films defining the capacitor element contain, as a main component, a resin containing at least one of a urethane bond or a urea bond. Examples of such a resin include a urethane resin having a urethane bond and urea resin having a urea bond. Examples may also include a resin having both a urethane bond and a urea bond. Specific examples thereof include curable resins and vapor-deposited polymer films which are described later.

The presence of a urethane bond and/or a urea bond can be confirmed using a Fourier transform infrared (FT-IR) spectrophotometer.

The term "main component" of the resin films as used herein refers to a component with the higher proportion (wt %), and preferably refers to a component whose proportion is more than 50 wt %. Thus, the resin films may contain other components in addition to the main component. Examples of the other components include additives such as silicone resin and uncured residues of starting materials such as a first organic material and a second organic material which are described later.

In the film capacitor of the present invention, the resin films defining the capacitor element may contain a curable resin as a main component. The curable resin may be a thermosetting resin or a photocurable resin. The curable resin may or may not contain at least one of a urethane bond or a urea bond.

The term "thermosetting resin" as used herein refers to a heat-curable resin, and the curing method is not limited. Thus, the thermosetting resin encompasses a resin cured by a method other than heat (such as light or electron beam) as long as the resin is heat curable. Some materials may start a reaction due to their own reactivity. The thermosetting resin also includes such materials that do not necessarily require external heat, light, or the like to start curing. The same applies to the photocurable resins, and the curing method is not limited.

In the film capacitor of the present invention, the resin films defining the capacitor element may each include a vapor-deposited polymer film as a main component. The vapor-deposited polymer film may or may not contain at least of one of a urethane bond or a urea bond.

The term "vapor-deposited polymer film" refers to a film formed by vapor deposition polymerization. In principle, the curable resin includes such a film.

In the film capacitor of the present invention, preferably, the resin films defining the capacitor element are made of a cured product of the first organic material and the second organic material. Examples thereof include a cured product obtained by a reaction between a hydroxyl group (OH group) of the first organic material and an isocyanate group (NCO group) of the second organic material.

When a cured product is obtained by the above reaction, the resulting films may contain uncured residues of the starting materials. For example, the resin films may contain at least one of an isocyanate group (NCO group) or a hydroxyl group (OH group). In this case, the resin films may contain either one or both of an isocyanate group and a hydroxyl group.

The presence of an isocyanate group and/or a hydroxyl group can be confirmed using a Fourier transform infrared (FT-IR) spectrophotometer.

Preferably, the first organic material is a polyol having two or more hydroxyl groups (OH groups) in the molecule. Examples of the polyol include polyether polyols, polyester polyols, and polyvinyl acetoacetal. The first organic material may be any combination of two or more organic materials. The first organic material is preferably a phenoxy resin belonging to polyether polyols.

The second organic material is preferably an isocyanate compound, an epoxy resin, or a melamine resin having two or more functional groups in the molecule. The second organic material may be any combination of two or more organic materials.

Examples of the isocyanate compound include aromatic polyisocyanates such as diphenylmethane diisocyanate (MDI) and tolylene diisocyanate (TDI); and aliphatic polyisocyanates such as hexamethylene diisocyanate (HDI). Examples may also include modified products of these polyisocyanates, such as a modified product containing carbodiimide or urethane, for example. Of these, aromatic polyisocyanates are preferred, and MDI is more preferred.

Any epoxy resin may be used as long as it is a resin having an epoxy ring. Examples thereof include bisphenol A epoxy resins, epoxy resins having a biphenyl skeleton, epoxy resins having a cyclopentadiene skeleton, and epoxy resins with a naphthalene skeleton.

Any melamine resin may be used as long as it is an organic nitrogen compound having a triazine ring at the center of the structure and three amino groups around the triazine ring. Examples thereof include alkylated melamine resin. Examples may also include modified products of melamine.

In the film capacitor of the present invention, preferably, the resin films defining the capacitor element are obtained by molding a resin solution containing the first organic material and the second organic material into films and curing the films by heat treatment.

In the film capacitor of the present invention, the resin films defining the capacitor element may contain a thermoplastic resin as a main component. Examples of the thermoplastic resin include highly crystalline polypropylene, polyethersulfone, polyetherimide, and polyarylate.

In the film capacitor of the present invention, the resin films defining the capacitor element may contain additives that provide other functions. For example, addition of a leveling agent can provide smoothness. A more preferred additive is a material having a functional group that reacts with a hydroxyl group and/or an isocyanate group, which forms part of the crosslinked structure of the cured product. Examples of such a material include a resin having at least one functional group selected from the group consisting of epoxy groups, silanol groups, and carboxyl groups.

In the film capacitor of the present invention, the resin films defining the capacitor element may have any thickness. Yet, the thickness of each resin film is preferably 5 μm or less, more preferably less than 3.5 μm, still more preferably 3.4 μm or less. At the same time, the thickness of the resin film is preferably 0.5 μm or more.

The thickness of the resin film can be measured by an optical film thickness gauge.

There may be case, for example, where the resin films defining the capacitor element are made thinner while the winding length of the resin films is kept the same. In such a case, since the resin films are thinner, the capacitor element has a smaller volume, and the outer case also has a smaller size according to the volume of the capacitor element. Yet, since the winding length of the resin films is kept the same, the amount of space between the resin films remains the same. In other words, the amount of space relative to the volume of the capacitor element is larger when the resin films are thinner. Thus, when the capacitor element expands due to evaporation of moisture between the resin films of the capacitor element, the amount of volume change in the capacitor element itself is larger as the resin films are thinner.

In the film capacitor of the present invention, when the outer case is made of a resin composition containing LCP and an inorganic filler, deformation of the outer case can be reduced or prevented even when the resin films are thinner (e.g., 3.4 μm or less).

In the film capacitor of the present invention, the metal layers defining the capacitor element may contain any metal, but preferably, the metal layer preferably contains at least one selected from the group consisting of aluminum (Al), titanium (Ti), zinc (Zn), magnesium (Mg), tin (Sn), and nickel (Ni).

In the film capacitor of the present invention, the metal layers defining the capacitor element may have any thickness. Yet, in view of reducing or preventing damage to the metal layers, the thickness of each metal layer is preferably 5 nm to 40 nm.

The thickness of the metal layer can be determined by observation of a cross section obtained by cutting the metallized film in a thickness direction, using an electronic microscope such as a field emission scanning electron microscope (FE-SEM).

Figure 5:
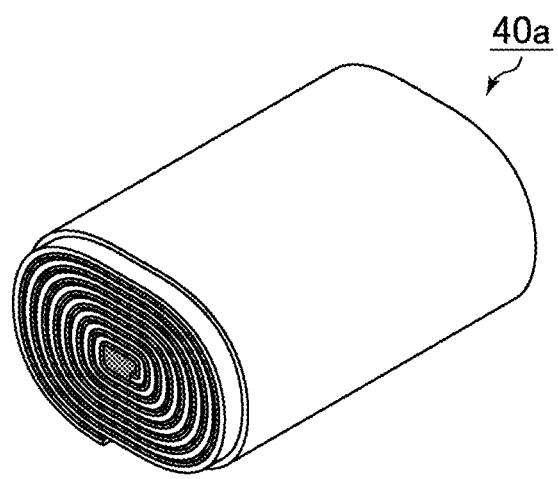
FIG. 5 is a schematic perspective view of another example of the wound body of the metallized films defining the capacitor element shown in FIG. 3A and FIG. 3B.

FIG. 5 is a schematic perspective view of another example of the wound body of the metallized films defining the capacitor element shown in FIG. 3A and FIG. 3B.

In the film capacitor of the present invention, when the capacitor element includes a wound body of metallized films, preferably, the wound body is pressed into a flat shape having an oval or oblong cross section as in the wound body 40a of the metallized films shown in FIG. 5, so that the wound body has a more compact shape.

In this case, the outer case can be made smaller by reducing the dead space inside the outer case, so that the film capacitor can be made smaller as a whole.

When the capacitor element expands due to evaporation of moisture between the resin films of the capacitor element, in the case of a cylindrical wound body of metallized films as shown in FIG. 4, the capacitor element radially expands from the center of a circular cross section, so that the expansion occurs uniformly. In the case of a flat wound body of metallized films as shown in FIG. 5, the radial expansion does not occur from the center of a cross section. In particular, since the wound body is pressed, a bias (or springiness) is given outwardly to a portion of the resin films which is not plastically deformed to restore the shape. Thus, while the capacitor element expands, the bias applied to the portion not plastically deformed is superimposed, so that the outer case more easily deforms than an outer case of a cylindrical wound body of metallized films.

In the film capacitor of the present invention, when the outer case is made of a resin composition containing LCP and an inorganic filler, deformation of the outer case can be reduced or prevented even when the wound body of the metallized films has a flat shape.

In the film capacitor of the present invention, when the capacitor element includes a wound body of metallized films, the capacitor element may include a cylindrical winding shaft. The winding shaft is arranged on the central axis of the metallized films being wound, and serves as a spool for winding the metallized films.

In the film capacitor of the present invention, the size and shape of the capacitor element are determined depending on the capacity of the capacitor, so that various sizes of capacitor elements can be used.

For example, when the capacity of the capacitor is 1 pF to 150 pF, the size of the capacitor element having an oblong cross section is preferably as follows: the oblong cross section has a major axis of 15 mm to 65 mm and a minor axis of 2 mm to 50 mm, and the length of the capacitor element in a longitudinal direction (a direction from a front cross section to a rear cross section, including the external electrodes) is 10 mm to 50 mm.

In this case, preferably, the outer case has an outer shape in which the long side of the bottom is 16 mm to 73 mm, the short side of the bottom is 3 mm to 58 mm, and the height of the outer case is 10.5 mm to 50.5 mm. In addition, the thickness of the outer case is preferably 0.5 mm to 3 mm, more preferably 0.5 mm to 2 mm.

In the film capacitor of the present invention, preferably, the volume of the capacitor element is 30% to 85% relative to the inner volume of the outer case. When the volume of the capacitor element is more than 85% relative to the inner volume of the outer case, it is difficult to fix the outer case and the capacitor element by the filling resin. When the volume of the capacitor element is less than 30% relative to the inner volume of the, the outer case is too large relative to the capacitor element, resulting in a large film capacitor.

In the film capacitor of the present invention, the clearance between the inner surfaces of the outer case and the outer surfaces of the capacitor element is preferably 1 mm to 5 mm, more preferably 1 mm to 2 mm.

The film capacitor can be made smaller as the size of the outer case is closer to the size of the capacitor element. Yet, this makes the outer case easily deformable when the capacitor element expands due to evaporation of moisture between the resin films of the capacitor element.

In the film capacitor of the present invention, when the outer case is made of a resin composition containing LCP and an inorganic filler, deformation of the outer case can be reduced or prevented even when the size of the outer case is brought closer to the size of the capacitor element.

Lead Terminal

In the film capacitor of the present invention, lead terminals protrude from the filling resin filling the outer case to the outside of the outer case.

Portions of the lead terminals which are electrically connected to the respective external electrodes of the capacitor element are provided in small regions of the external electrodes. Thus, when a load is applied to the lead terminals, the lead terminals may be separated from the external electrodes. Thus, in the outer case, the filling resin is located around the external electrodes of the capacitor element and the lead terminals so as to tightly fix the external electrodes and the lead terminal. As a result, even when a load is applied to the protruding portions of the lead terminals, the connection between the lead terminals and the external electrodes is reinforced by the filling resin, preventing or reducing separation therebetween.

The lead terminals may be connected to the external electrodes in the middle of the external electrodes or at ends of the electrodes near the opening as shown in FIG. 1 of JP 4733566 B.

Other Embodiments

FIG. 1A, FIG. 1B, and FIG. 1C each show an example where a single capacitor element is housed in a single outer case. Yet, for example, as shown in JP 2012-69840 A, multiple capacitor elements may be housed in a single outer case.

In addition, the above has described the case where the film capacitor is a wound film capacitor in which the first metallized film and the second metallized film are wound in a laminated state. Yet, the film capacitor may be a multilayer film capacitor in which the first metallized film and the second metallized film are laminated. Film capacitors such as a multilayer film capacitor can also achieve the above-described effects of the present invention.

Examples

Examples that more specifically disclose the film capacitor of the present invention are described below. The present invention is not limited to these examples.

Production of Resin Film

A polyvinyl acetoacetal (PVAA) resin powder was dissolved in a solvent mixture of toluene and methyl ethyl ketone to prepare a PVAA resin solution, and a tolylene diisocyanate (TDI)-trimethylolpropane (TMP) adduct prepolymer dissolved in ethyl acetate was added to the PVAA resin solution. Thus, a mixed resin solution was obtained. Here, the solids concentration and the amount of the solution were adjusted such that the mixing ratio (weight ratio) of PVAA to TDI prepolymer was 4:6.

The resulting mixed resin solution was applied to a polyethylene terephthalate (PET) substrate using a coater, dried, and cured by heat treatment at a temperature of 180° C. for one hour. Thus, a resin film having a thickness of 3 μm was produced.

Formation of Metal Layer

Aluminum was vapor-deposited to a thickness of 20 nm onto a surface of the resin film to form a metal layer. The resulting product was removed from the PET substrate, whereby a metallized film including a metal layer on one side of the resin film was obtained.

Production of Capacitor Device

The metallized film was slit to a 25 mm width at a desired position, and two such metallized films were wound together with a displacement from each other by 1 mm. Thus, a cylindrical wound body was obtained. The cylindrical wound body was pressed into a flat shape. Subsequently, external electrodes were formed by spraying zinc to a thickness of 1 mm on both end surfaces of the wound body.

Production of Sample Capacitor

Leads having a diameter of 1.2 mm were soldered to the external electrodes of the capacitor element. Then, the capacitor element was placed in a 1-mm thick outer resin case made of a resin composition having a resin material and a mixing ratio as shown in Table 1. A glass filler having a diameter of 10 μm and a length of 300 μm was used as the inorganic filler shown in Table 1.

The space between the capacitor element and the outer resin case was filled with an epoxy resin. The epoxy resin contained 55 wt % silica as a reinforcing agent. Thus, a sample capacitor (film capacitor) was produced.

Figure 6A:
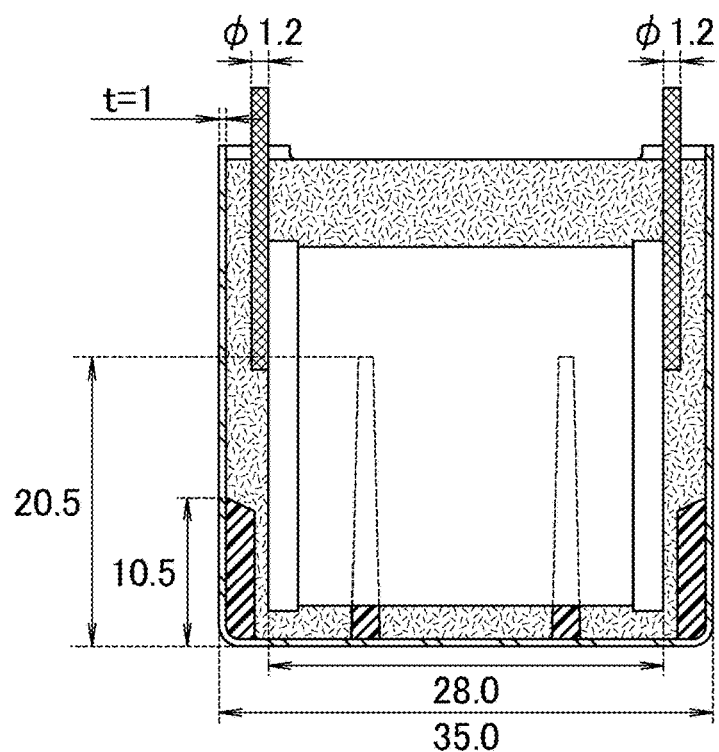
FIG. 6A and FIG. 6B are cross-sectional views showing dimensions of a sample capacitor.
Figure 6B:
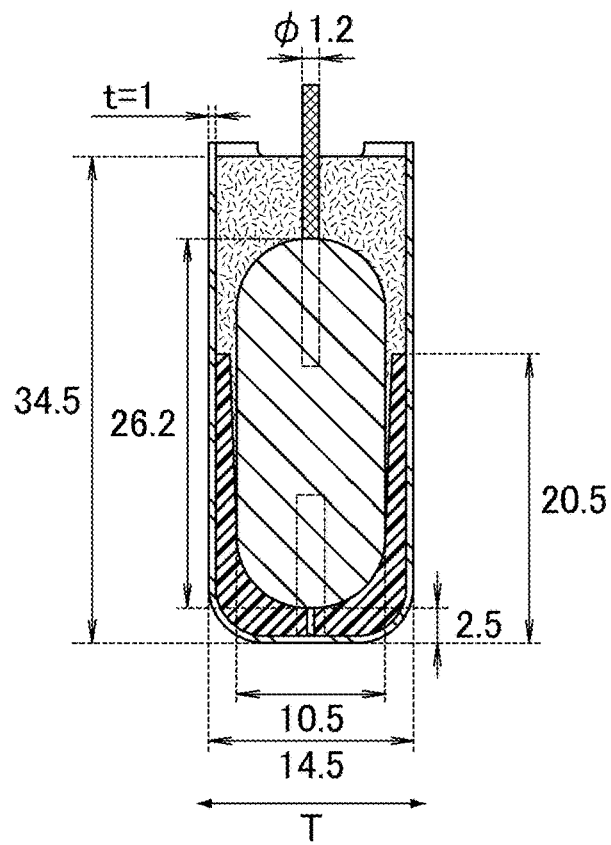
Figure 7A:
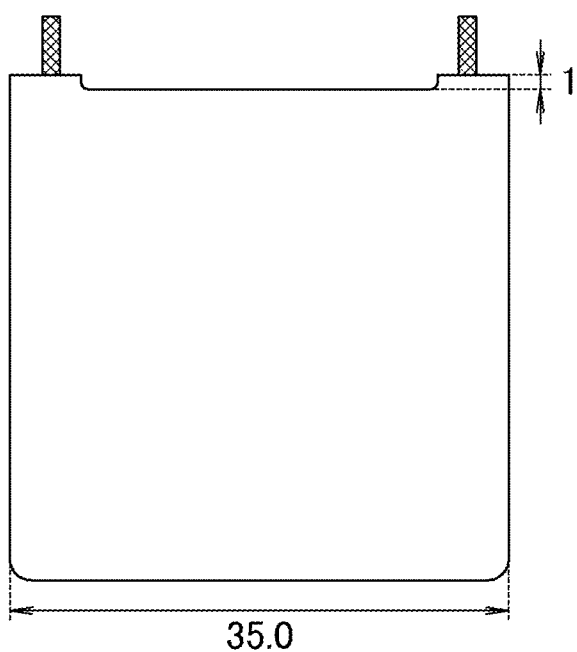
FIG. 7A and FIG. 7B are external views showing dimensions of the sample capacitor.
Figure 7B:
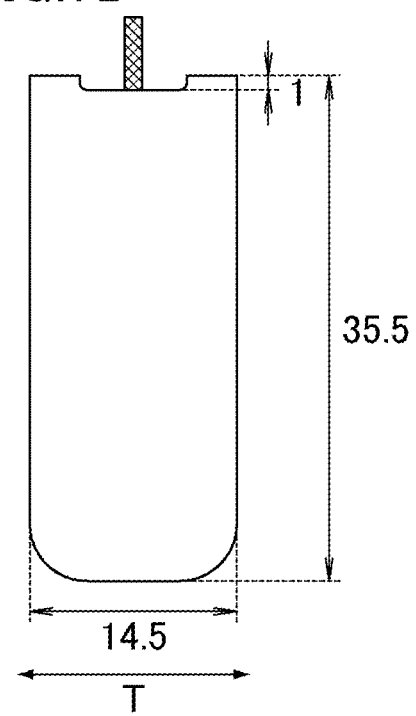

FIG. 6A and FIG. 6B are cross-sectional views showing dimensions of the sample capacitor. FIG. 7A and FIG. 7B are external views showing dimensions of the sample capacitor.

As shown in FIG. 6A and FIG. 6B, ribs was provided on inner surfaces of the outer resin case to improve the positional accuracy of the capacitor element during casting of the resin.

In addition, as shown in FIG. 7A and FIG. 7B, a depression (depth: 1 mm) was provided at an opening of the outer resin case to prevent an increase in inner pressure due to hermetic sealing between the film capacitor and a substrate when the film capacitor was mounted on the substrate.

Table 1 shows the surface free energy of the inner surface of the outer case, the coefficient of linear expansion of the outer case, and the difference in coefficient of linear expansion between the outer case and the filling resin.

Thermal Shock Test 1

Each sample capacitor produced (number n of samples=10) was subjected to a thermal shock test in which heating to +120° C. and cooling to −40° C. were repeated. The retention time at each temperature was 30 minutes. The samples after 1000 cycles were observed for the presence or absence of separation. When the number of samples separation was 0, the result was evaluated as good. When the number was 1 or more, the result was evaluated as poor. Table 2 shows the results.

Thermal Shock Test 2

Separately, each sample capacitor produced (number n of samples=10) was subjected to a thermal shock test in which heating to +130° C. and cooling to −40° C. were repeated. The retention time at each temperature was 30 minutes. The samples after 1000 cycles were observed for the presence or absence of separation. When the number of samples with separation was 0, the result was evaluated as good. When the number was 1 to 9, the result was evaluated as fair. When the number was 10, the result was evaluated as poor. Table 2 shows the results.

Moldability

The moldability of the outer case was evaluated by the following method. When the resin composition as a material of the case was spreading to every corner of the mold during molding of the outer case, the result was evaluated as good. When the resin composition was not spreading to every corner of the mold, the result was evaluated as poor. Table 2 shows the results.

Total Evaluation

A sample was evaluated as excellent when the results of thermal shock test 1, thermal shock test 2, and moldability were all good. A sample was evaluated as good when the results of thermal shock test 1 and moldability were good and the result of the thermal shock test 2 was fair. A sample was evaluated as fair when the results of thermal shock test 1 and thermal shock test 2 were good and the result of moldability was poor. A sample was evaluated as poor when the result of thermal shock test 1 or thermal shock test 2 was poor. Table 2 shows the results.

TABLE 1

| Sample No. | Resin | Inorganic filler wt % | Surface free energy mN/m | Coefficient of linear expansions ppm/° C. | Difference in coefficient of linear expansion between outer case and filing resin |
|---|---|---|---|---|---|
| 1 | LCP | 55 | 28 | 19 | 9 |
| 2 | LCP | 50 | 29 | 21 | 7 |
| 3 | LCP | 45 | 31 | 24 | 4 |
| 4 | LCP | 30 | 39 | 30 | 2 |
| * 5 | LCP | 10 | 45 | 38 | 10 |
| * 6 | LCP | 7 | 46 | 40 | 12 |
| 7 | PPS | 60 | 25 | 23 | 5 |
| 8 | PPS | 45 | 34 | 25 | 3 |
| 9 | PPS | 30 | 44 | 31 | 3 |

TABLE 2

| Sample No. | Separation after thermal shock test1 Condition: −40° C.⇔120° C. | Separation after thermal shock test2 Condition: −40° C.⇔130° C. | Mold-ability | Total evaluation |
|---|---|---|---|---|
| 1 | 0/10 (Good) | 0/10 (Good) | Poor | Far |
| 2 | 0/10 (Good) | 0/10 (Good) | Good | Excellent |
| 3 | 0/10 (Good) | 0/10 (Good) | Good | Excellent |
| 4 | 0/10 (Good) | 3/10 (Fair) | Good | Good |
| * 5 | 0/10 (Good) | 10/10 (Poor) | Good | Poor |
| * 6 | 4/10 (Poor) | 10/10 (Poor) | Good | Poor |
| 7 | 0/10 (Good) | 0/10 (Good) | Good | Excellent |
| 8 | 0/10 (Good) | 0/10 (Good) | Good | Excellent |
| 9 | 0/10 (Good) | 5/10 (Fair) | Good | Good |

The samples with "*" added to the numbers in Table 1 and Table 2 are comparative examples which are outside the scope of the present invention.

Table 1 and Table 2 show that when a surface free energy of the inner surface of the outer case was 44 mN/m or less, separation at an interface between the outer case and the filling resin was prevented.

Generally, separation at an interface between the outer case and the filling resin can be reduced or prevented by reducing the difference in coefficient of linear expansion between the outer case and the filling resin.

As shown in Table 1 and Table 2, in thermal shock test 1 in which a cycle of heating to +120° C. and cooling to −40° C. was repeated, separation occurred when the difference in coefficient of linear expansion between the outer case and the filling resin was 12 ppm/° C. as in sample 6, but separation was prevented when the difference in coefficient of linear expansion between the outer case and the filling resin was reduced to 10 ppm/° C. or less as in samples 1 to 5.

Yet, for example, in sample 4, separation occurred in thermal shock test 2 in which a cycle of heating to +130° C. and cooling to −40° C. was repeated, although the difference in coefficient of linear expansion between the outer case and the filling resin was very small (2 ppm/° C.). In contrast, in sample 1, no separation occurred in thermal shock test 2, although the difference in coefficient of linear expansion between the outer case and the filling resin was larger (9 ppm/° C.) than that in sample 4.

Presumably, based on the results of samples 1 to 6, reduction or prevention of separation at an interface between the outer case and the filling resin depends on not only the difference in coefficient of linear expansion between the outer case and the filling resin but also on the surface free energy of the inner surface of the outer case.

In addition, the results of samples 7 to 9 confirm that the film capacitors each including the outer case made of PPS also achieve the same effect as that achieved by the film capacitors each including the outer case made of LCP.

REFERENCE SIGNS LIST 1 film capacitor
10 capacitor element
11 first metallized film
12 second metallized film
13 first resin film
14 second resin film
15 first metal layer
16 second metal layer
20 outer case
21 first lateral wall
22 second lateral wall
23 third lateral wall
24 fourth lateral wall
25 depression
26 tapered portion
30 filling resin
40, 40a wound body of metallized films
41 first external electrode
42 second external electrode
51 first lead terminal
52 second lead terminal
60 first rib
70 second rib

The invention claimed is:

1. A film capacitor comprising:
a capacitor element having a metallized film including a resin film and a metal layer on a surface of the resin film;

an outer case that houses the capacitor element; and
a filling resin that fills a space between the capacitor element and the outer case,
wherein a surface free energy of an inner surface of the outer case in contact with the filling resin is 44 mN/m or less.

2. The film capacitor according to claim 1, wherein the surface free energy is 34 mN/m or less.

3. The film capacitor according to claim 1, wherein the surface free energy is 25 mN/m to 44 mN/m.

4. The film capacitor according to claim 1, wherein a difference in coefficient of linear expansion between the outer case and the filling resin is 11 ppm/° C. or less.

5. The film capacitor according to claim 4, wherein the difference in coefficient of linear expansion is more than 0 ppm/° C.

6. The film capacitor according to claim 1, wherein the outer case is made of a resin composition.

7. The film capacitor according to claim 6, wherein the resin composition contains a liquid crystal polymer.

8. The film capacitor according to claim 6, wherein the resin composition contains polyphenylene sulfide.

9. The film capacitor according to claim 7, wherein the resin composition further contains an inorganic filler, and an amount of the inorganic filler in the resin composition is 54 wt % or less.

10. The film capacitor according to claim 8, wherein the resin composition further contains an inorganic filler, and an amount of the inorganic filler in the resin composition is 60 wt % or less.

11. The film capacitor according to claim 9, wherein the amount of the inorganic filler in the resin composition is 30 wt % to 54 wt %.

12. The film capacitor according to claim 11, wherein the inorganic filler contains a glass filler as a main component thereof.

13. The film capacitor according to claim 1, wherein the outer case is made of a metal or an alloy.

14. The film capacitor according to claim 1, wherein the filling resin contains an epoxy resin.

15. An outer case of a film capacitor, the outer case constructed to house a capacitor element having a metallized film including a resin film and a metal layer on a surface of the resin film, and to house a filling resin in a space between the capacitor element and the outer case, wherein a surface free energy of an inner surface of the outer case is 44 mN/m or less.

16. The outer case according to claim 15, wherein the surface free energy is 34 mN/m or less.

17. The outer case according to claim 15, wherein the surface free energy is 25 mN/m to 44 mN/m.

18. The outer case according to claim 15, wherein the outer case is made of a resin composition.

19. The outer case according to claim 18, wherein the resin composition contains a liquid crystal polymer.

20. The outer case according to claim 18, wherein the resin composition contains polyphenylene sulfide.

21. The outer case according to claim 19, wherein the resin composition further contains an inorganic filler, and an amount of the inorganic filler in the resin composition is 54 wt % or less.

22. The outer case according to claim 20, wherein the resin composition further contains an inorganic filler, and an amount of the inorganic filler in the resin composition is 60 wt % or less.

23. The outer case according to claim 21, wherein the amount of the inorganic filler in the resin composition is 30 wt % to 54 wt %.

24. The outer case according to claim 23, wherein the inorganic filler contains a glass filler as a main component thereof.

25. The outer case according to claim 15, wherein the outer case is made of a metal or an alloy.

* * * * *